US006812089B2

(12) United States Patent
Choi et al.

(10) Patent No.: US 6,812,089 B2
(45) Date of Patent: Nov. 2, 2004

(54) METHOD OF MANUFACTURING FERROELECTRIC MEMORY DEVICE

(75) Inventors: Eun-Seok Choi, Ichon-shi (KR); Nam-Kyeong Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/620,927

(22) Filed: Jul. 16, 2003

(65) Prior Publication Data

US 2004/0126959 A1 Jul. 1, 2004

(30) Foreign Application Priority Data

Dec. 30, 2002 (KR) ................................ 10-2002-0086308

(51) Int. Cl.[7] ........................................... H01L 21/8242

(52) U.S. Cl. ........................... 438/240; 438/3; 438/253; 438/396

(58) Field of Search ............................ 438/3, 240, 253, 438/396, 397

(56) References Cited

U.S. PATENT DOCUMENTS 5,337,207 A * 8/1994 Jones et al. .............. 361/321.1
5,566,045 A * 10/1996 Summerfelt et al. ..... 361/321.1
5,664,989 A * 9/1997 Nakata et al. ................ 451/41
6,093,575 A * 7/2000 Eguchi .......................... 438/3
6,576,527 B2 * 6/2003 Nakamura .................. 438/396
6,699,725 B2 * 3/2004 Lee .............................. 438/3
2002/0109168 A1 * 8/2002 Kim et al. .................. 257/295

FOREIGN PATENT DOCUMENTS

JP 10189912 A * 7/1998 ......... H01L/27/108

* cited by examiner

*Primary Examiner*—Michael Trinh
*Assistant Examiner*—Christy Novacek
(74) *Attorney, Agent, or Firm*—Blakely Sokoloff Taylor & Zafman

(57) ABSTRACT

The present invention is related to a method for fabricating a ferroelectric memory device effectively preventing a deformation and lift of a lower electrode caused by a different thermal expansion rate between the lower electrode and a inter layer dielectric film at a succeeding heat treatment process. The method for fabricating a ferroelectric memory device includes: forming a lower electrode on a predetermined surface of a semiconductor substrate; forming a metal oxide layer over a surface of the lower electrode and a surface of the semiconductor substrate; forming an inter layer dielectric film over the metal oxide layer; performing a blanket etching for the inter layer dielectric film and the metal oxide layer; and forming an opening having a predetermined depth.

10 Claims, 2 Drawing Sheets

31
30
29
28
27
26
25
23
24
22
21
20

METHOD OF MANUFACTURING FERROELECTRIC MEMORY DEVICE

FIELD OF THE INVENTION

The present invention relates to a ferroelectric memory device; and, more particularly, to a method for fabricating the ferroelectric memory capable of preventing a deformation or lift of an electrode by using a heat treatment process.

DESCRIPTION OF RELATED ARTS

A semiconductor memory device using a ferroelectric material as a storage capacitor and a development of the device has been progressed in order to alleviate a refresh problem required to a prior dynamic random access memory (DRAM). A ferroelectric random access memory (FeRAM) device using such a ferroelectric material is one of non volatile memory devices which have such advantages as keeping a stored data maintained even on power-off condition and competing with the prior DRAM device in terms of an operation speed. Accordingly, the FeRAM device is promised to be a next generation memory device.

Such materials as $(Bi, La)_4Ti_3O_{12}$ (BLT), $SrBi_2Ta_2O_9$ (SBT), $SrBi_2(Ta_{1-x}, Nb_x)_2O_9$ (SBTN), and $(Pb, Zr)TiO_3$ (PZT) are usually used for forming a film of the ferroelectric material for the FeRAM device. Such a metal as platinum (Pt), iridium (Ir), ruthenium (Ru) or platinum (Pt) having a superior resistance to an oxidation is used for an upper and lower electrode of a storage capacitor at a high heat treatment process for the ferroelectric film formation. A barrier metal layer and a plug for a storage node contact are buried inside an inter layer dielectric film for the purpose of preventing a diffusion between the lower electrode constituted with the metal mentioned above and the plug.

FIG. 1 is a cross-sectional view showing a conventional ferroelectric memory device. As shown, a first inter layer dielectric film 11 is formed on a semiconductor substrate 10 and a tungsten plug 12 for the storage node contacting to the semiconductor substrate is formed inside the inter layer dielectric film 11. The lower electrode 14 is formed over the plug 12 and a predetermined area of the first inter layer dielectric film 11 around the plug 12. A barrier metal layer 13 buried inside the first inter layer dielectric film is formed between the plug 12 and the lower electrode 14 and a second inter layer dielectric film 15 is formed over the first inter layer dielectric film 11, wherein the second inter layer dielectric film is laterally arranged to the lower electrode 14. Herein, an upper surface of the lower electrode 14 should not be covered by the second inter layer dielectric film. Also, a ferroelectric film 16 is formed over the lower electrode 14 and the second inter layer dielectric film 15. The upper electrode 17 is then formed on the ferroelectric film 16 deposited on the lower electrode 14. A third inter layer dielectric film 18 is formed over an upper area of the ferroelectric film 16 and a predetermined area of the upper electrode 17. A wire 19 contacting to an inner side of the third inter layer dielectric film 18 and a predetermined upper area of the upper electrode 18 is formed. Herein, the lower electrode 14 is generally constituted with the metal, i.e., such metal as Pt, Ir, Ru, or Pt and the first, second, and third inter layer dielectric film 11, 15 and 18 are all formed with a oxide layer. Also, a glue layer constituted with a metal oxide could be formed between the lower electrode 14 and the first inter layer dielectric film 11, wherein the glue layer is not illustrated and used to improve an adhesion between the lower electrode 14 and the first inter layer dielectric film 11.

However, in the conventional ferroelectric memory device, since the side wall of the lower electrode 14 is covered by the second inter layer dielectric film, and the lower electrode 14 is subjected to a different thermal expansion rate between the lower electrode 14 metal and the inter layer dielectric films 11, a strong compressive stress is exerted to the lower electrode 14 at a deposition and heat treatment process for a ferroelectric layer formation 16. As a result, not only a deformation and lift of the lower electrode 14 but also an exposure and oxidation of the barrier metal layer 13 which are caused by the lift of the lower electrode 14 can occurs. Furthermore, a failure in the storage node contact may happen.

SUMMARY OF THE INVENTION

It is, therefore, an object of the present invention to provide a method for fabricating a ferroelectric memory device effectively preventing a deformation and lift of a lower electrode caused by a different thermal expansion rate between a lower electrode and a inter layer dielectric film at a succeeding heat treatment process.

In accordance with an aspect of the present invention, there is provided the method for fabricating ferroelectric memory device, including: forming a lower electrode on a predetermined surface of a semiconductor substrate; forming a metal oxide layer over a surface of the lower electrode and a surface of the semiconductor substrate; forming an inter layer dielectric film over the metal oxide layer; performing a blanket etching for the inter layer dielectric film and the metal oxide layer in order to expose an upper surface of the lower electrode; and forming an opening which has a predetermined depth, wherein the opening is obtained by removing only the metal oxide layer between the inter layer dielectric film and the lower electrode through a selective etching process.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, an inventive ferroelectric memory device and a method for fabricating the ferroelectric memory device capable of effectively preventing a deformation and lift of a lower electrode caused by a different thermal expansion rate between a lower electrode and a inter layer dielectric (ILD) film at a succeeding heat treatment process will be described in detail referring to the accompanying drawings.

FIGS. 2A to 2D are successive cross-sectional views showing a method for fabricating the ferroelectric memory device in accordance with a preferred embodiment of the present invention.

Figure 1:
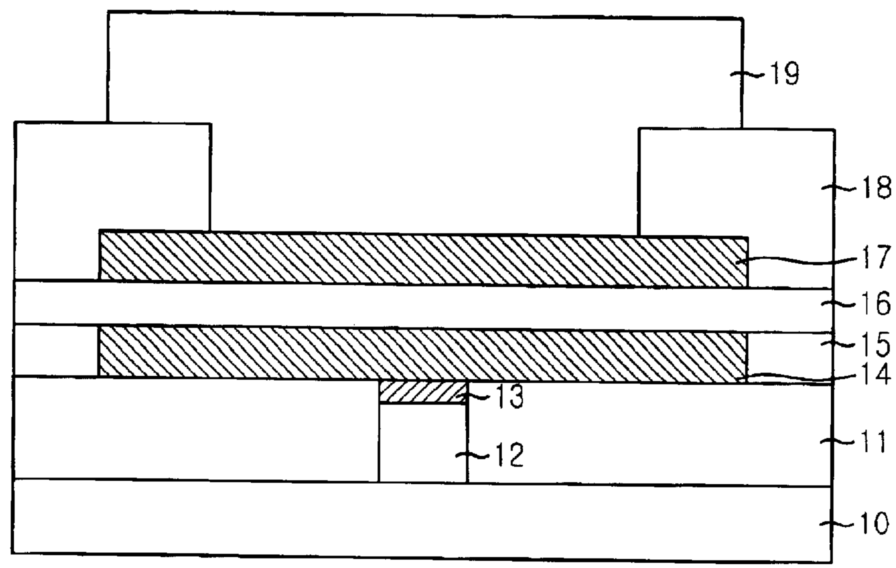
FIG. 1 is a cross-sectional view showing a conventional ferroelectric memory device.
Figure 2A:
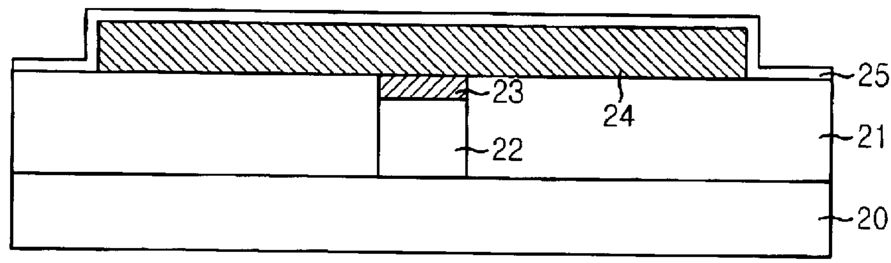
FIGS. 2A to 2D are successive cross-sectional views showing a method for fabricating a ferroelectric memory device in accordance with a preferred embodiment of the present invention.

Referring to FIG. 2A, a first inter layer dielectric film 21 is formed over a semiconductor substrate 20 and a contact hole for a storage node is formed by etching a predetermined area of the first inter layer dielectric film 21. A tungsten is deposited in the contact hole of the first inter layer dielectric film and eventually, a tungsten plug 22 for the storage node is formed after performing an etch-back or chemical mechanical polishing (CMP) process, wherein a predetermined height of the contact plug 22 is smaller than the depth of the contact hole and an extra space formed in the difference between the height of the contact plug 22 and the depth of the contact hole is filled up with a TiN to form a barrier metal layer 23. The barrier metal layer 23 is completely formed after performing a blanket etching adopting the etch back process or the CMP process for exposing the first inter layer dielectric film 21. As a next step, metal layers for forming the lower electrode is formed over an entire surface of the first inter layer dielectric film 21 and the barrier layer 23, wherein the metal layer is constituted sequentially with an iridium (Ir) layer, an iridium oxide (IrOx) layer and a platinum (Pt) layer. The Pt layer, the IrOx layer and the Ir layer are patterned and thus, the complete lower electrode 24 having a stack pattern of Pt/IrOx/Ir layer is formed. A glue layer could be formed to improve an adhesive property between the lower electrode 24 and the first inter layer dielectric film before forming the lower electrode 24 even though the glue layer is not illustrated. A metal oxide layer 25 having a thickness of about 1 Å to about 500 Å is formed on a surface of the lower electrode 24 and the first inter layer dielectric film 21. At this time, a width of an opening which will be formed by a succeeding process can be controlled by varying the thickness of the metal oxide layer 25. Herein, the metal oxide layer 25 is formed by depositing one of such materials as an $Al_2O_3$ layer, a $TiO_2$ layer, a $TaO_2$ layer, a $ZrO_2$ layer and a $HfO_2$ layer.

Figure 2B:
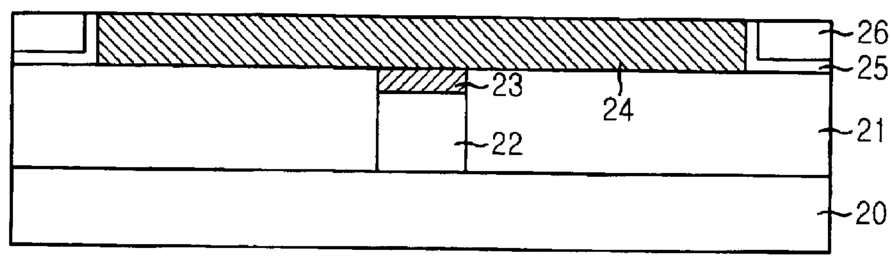

A second inter layer dielectric film 26 is formed on an entire surface of the above substrate. Next, a blanket etching process adopting the etch back process or CMP process is carried out in order to expose the lower electrode 24. As a result, such structure as shown in FIG. 2B is obtained.

Figure 2C:
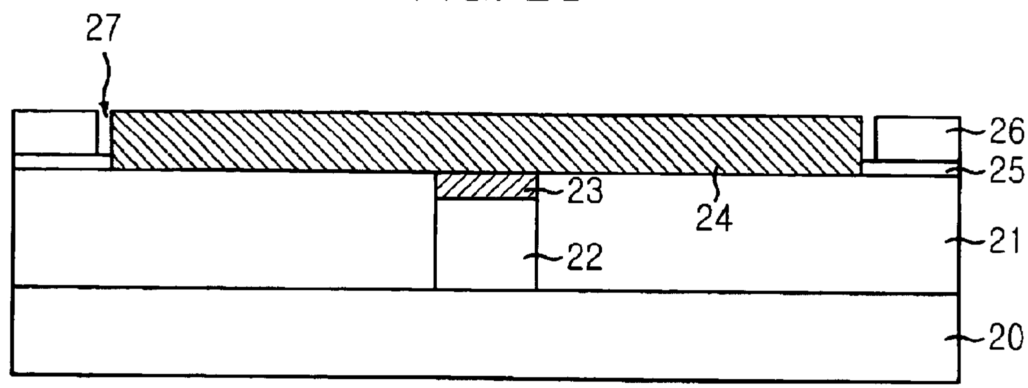

Referring to FIG. 2C, the opening, which will be used as a buffer for the second inter layer dielectric film 26 and the lower electrode 24 at a heat treatment process, is formed between the second inter layer dielectric film 26 and the lower electrode 24 by carrying out a wet selective etching process. At this time, one etching solution containing at least one chosen among a sulfuric acid, nitric acid and phosphoric acid, or the other etching solution containing an ammonia ($NH_4OH$) liquid or a hydrogen peroxide ($H_2O_2$) liquid is used for the wet selective etching process, and a concentration of the etching solutions range from about 0% to about 50%.

In addition, the depth of the opening can be controlled by varying an etching time.

Figure 2D:
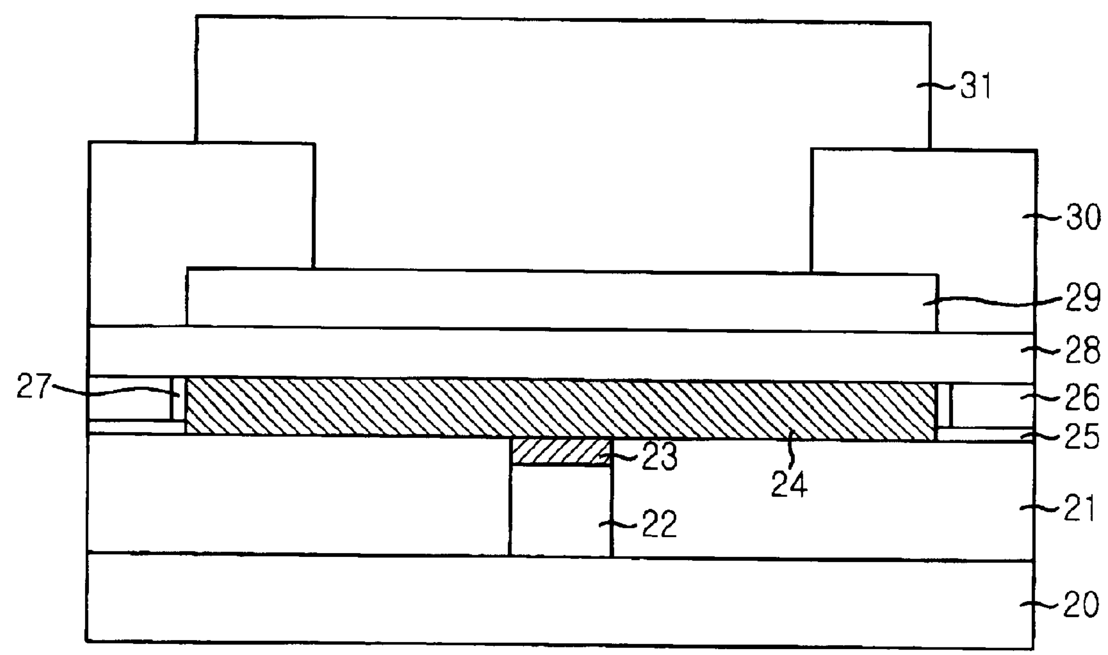

Referring to FIG. 2D, a ferroelectric layer 28 is formed on the lower electrode 24 and second inter layer dielectric film 26 by carrying out a deposition process such as a spin-on glass. At this time, the ferroelectric layer 28 is formed by using one of (Bi, La)$_4$Ti$_3$O$_{12}$ (BLT), $SrBi_2Ta_2O_9$ (SBT), SrBi$_2$(Tal-x, Nbx)$_2$O$_9$ (SBTN) and (Pb, Zr)TiO$_3$ (PZT). Eventually, an uniform ferroelectric layer 28 is formed over the lower electrode 24 and second inter layer dielectric film 26 comprising the opening, so that the opening 27 secures enough space to serve as a heat expansion buffer. A heat treatment process is performed to mitigate stress exerted on the deposited layers. Herein, the opening 27 formed between the lower electrode 24 and the second inter layer dielectric film 26 acts as a means capable of mitigating the stress exerted on the lower electrode 24 when the lower electrode 24 can be subjected to a heat expansion at the heat treatment process. As a result, the deformation and lift of the lower electrode, which can be often seen in the conventional ferroelectric memory device, do not happen due to the opening 27 acting as the buffer.

As a next step, an upper electrode 29 is formed on the ferroelectric layer 28, and a third inter layer dielectric film 30 is formed over an entire surface of the above substrate.

A contact hole for an electrical line 31 is then formed by etching the third inter layer dielectric film 30. At this time, a predetermined area of the upper electrode 29 is exposed. A metal layer is deposited over the entire surface of the resulting structure and connected to the upper electrode 29. As a result, the contact hole is buried by the metal layer, and the complete electrical line 31 is formed after carrying out a patterning process for removing an predetermined area of the metal layer.

In conclusion, the structure of the present invention is contrived to prevent the deformation and the lift of the lower electrode, wherein the deformation and lift is caused by the stress exerted at the lower electrode. To alleviate those drawbacks, the opening 27 acting as the heat expansion buffer is formed between the lower electrode and the second inter layer dielectric film.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a ferroelectric memory device, comprising the steps of:

a1) forming a lower electrode on a predetermined surface of a semiconductor substrate;

b1) forming a metal oxide layer over a surface of the lower electrode and a surface of the semiconductor substrate;

c1) forming an inter layer dielectric film over the metal oxide layer;

d1) performing a blanket etching for the inter layer dielectric film and the metal oxide layer in order to expose an upper surface of the lower electrode; and e1) forming an opening which has a predetermined depth, wherein the opening is obtained by removing only the metal oxide layer between the inter layer dielectric film and the lower electrode through a selective etching process;

a2) forming a ferroelectric layer on the lower electrode and the inter layer dielectric film; and b2) forming an upper electrode on the ferroelectric layer formed on the lower electrode.

2. The method as recited in claim 1, wherein the metal oxide layer is formed by using one of an $Al_2O_3$ layer, an $TiO_2$ layer, a $TaO_2$ layer, a $ZrO_2$ layer.

3. The method as recited in claim 1, wherein a thickness of the metal oxide layer ranges from about 1 Å to about 500 Å.

4. The method as recited in claim 1, wherein the lower electrode is constituted sequentially with an platinum (Pt) layer, an iridium oxide (IrOx) layer and an iridium (Ir) layer.

5. The method as recited in claim 4, wherein the ferroelectric layer is constituted with one of materials of (Bi, La)$_4$Ti$_3$O$_{12}$ (BLT), $SrBi_2Ta_2O_9$(SBT), SrBi$_2$(Tal-x, Nbx)$_2$O$_9$ (SBTN), and (Pb, Zr)TiO$_3$ (PZT).

6. The method as recited in claim 1, wherein a wet etching is carried out by using a selective etching process.

7. The method as recited in claim 6, wherein the wet selective etching process is carried out by using an etching solution containing at least one selected from a group of sulfuric acid, nitric acid and phosphoric acid.

8. The method as recited in claim 7, wherein a concentration of the etching solution for the wet selective etching process ranges from about 0% to about 50%.

9. The method as recited in claim 6, wherein the wet etching process is carried out by using an etching solution containing a ammonia ($NH_4OH$) liquid or a hydrogen peroxide ($H_2O_2$) liquid.

10. The method as recited in claim 7, wherein a concentration of the etching solution containing the ammonia ($NH_4OH$) liquid or hydrogen peroxide ($H_2O_2$) liquid ranges from about 0% to about 50%.

* * * * *